United States Patent
Murakami et al.

(10) Patent No.: US 8,685,598 B2
(45) Date of Patent: Apr. 1, 2014

(54) PELLICLE AND MASK ADHESIVE THEREFOR

(75) Inventors: Shuichi Murakami, Shizuoka (JP); Takashi Kozeki, Otake (JP); Minehiro Mori, Chiba (JP)

(73) Assignee: Mitsui Chemicals, Inc., Minato-Ku, Tokyo (JP)

(*) Notice: Subject to any disclaimer, the term of this patent is extended or adjusted under 35 U.S.C. 154(b) by 43 days.

(21) Appl. No.: 13/500,513

(22) PCT Filed: Oct. 6, 2010

(86) PCT No.: PCT/JP2010/005996
§ 371 (c)(1),
(2), (4) Date: Apr. 5, 2012

(87) PCT Pub. No.: WO2011/043071
PCT Pub. Date: Apr. 14, 2011

(65) Prior Publication Data
US 2012/0202144 A1    Aug. 9, 2012

(30) Foreign Application Priority Data
Oct. 7, 2009 (JP) .............................. 2009-233576

(51) Int. Cl.
*G03F 1/00* (2012.01)
*C08L 23/00* (2006.01)

(52) U.S. Cl.
USPC .............................................. 430/5; 524/528

(58) Field of Classification Search
USPC .......... 430/5; 428/14; 524/502–505, 490, 528
See application file for complete search history.

(56) References Cited

U.S. PATENT DOCUMENTS

| 5,026,752 A | 6/1991 | Wakabayashi et al. |
| 5,859,114 A * | 1/1999 | Davis et al. .................... 524/490 |
| 8,338,697 B2 | 12/2012 | Hoya et al. |
| 8,470,449 B2 | 6/2013 | Hoya et al. |

(Continued)

FOREIGN PATENT DOCUMENTS

| CN | 1862378 A | 11/2006 |
| CN | 101065438 | 10/2007 |

(Continued)

OTHER PUBLICATIONS

International Search Report (PCT/ISA/210) issued on Dec. 21, 2010, by Japanese Patent Office as the International Searching Authority for International Application No. PCT/JP2010/005996.

*Primary Examiner* — Stewart Fraser
(74) *Attorney, Agent, or Firm* — Buchanan Ingersoll & Rooney PC

(57) ABSTRACT

Disclosed is a pellicle having a mask adhesive layer having appropriate softness, having a small adhesive residue after being peeled off from a mask, and having good handling characteristics; and a pellicle for preventing position deviation of patterns, in particular in double patterning. The pellicle of the present invention includes a pellicle frame, a pellicle membrane disposed on one end surface of the pellicle frame, and a mask adhesive layer disposed on other end surface of the pellicle frame; wherein the mask adhesive layer includes 35 to 170 weight parts of a hardness adjuster (B) containing a polypropylene (b1) and a propylene based elastomer (b2) per 100 weight parts of a styrene resin (A); and in an electron microscopic photograph of the mask adhesive layer, a phase-separated structure of a continuous phase of the styrene resin (A) and a discontinuous phase of the hardness adjuster (B) is observed.

12 Claims, 4 Drawing Sheets

(56) References Cited

U.S. PATENT DOCUMENTS

| | | | |
|---|---|---|---|
| 2006/0257754 A1* | 11/2006 | Harubayashi et al. | 430/5 |
| 2008/0090418 A1 | 4/2008 | Jeon et al. | |
| 2008/0090419 A1 | 4/2008 | Koh et al. | |
| 2008/0315159 A1 | 12/2008 | Minagoshi | |

FOREIGN PATENT DOCUMENTS

| | | |
|---|---|---|
| JP | 1-026688 A | 1/1989 |
| JP | 4-237056 A | 8/1992 |
| JP | 9-045106 A | 2/1997 |
| JP | 2000-267261 A | 9/2000 |
| JP | 2004-352755 A | 12/2004 |
| JP | 2005-308901 A | 11/2005 |
| JP | 2006-142735 A | 6/2006 |
| JP | 2007-156397 A | 6/2007 |
| JP | 2008-103718 A | 5/2008 |
| JP | 2008-103719 A | 5/2008 |
| JP | 2008-115212 A | 5/2008 |
| JP | 2008-159701 A | 7/2008 |
| JP | 2008-308516 A | 12/2008 |
| WO | WO 2008/149997 A1 | 12/2008 |
| WO | WO2009/008294 A1 | 1/2009 |
| WO | WO2009/084517 A1 | 7/2009 |
| WO | WO 2010/116848 A1 | 10/2010 |

* cited by examiner

TABLE 1

| | | Ex. 1 | Ex. 2 | Ex. 3 | Ex. 4 | Ex. 5 | Ex. 6 | Comp.Ex 1 | Comp.Ex 2 | Comp.Ex 3 | Comp.Ex 4 | Comp.Ex 5 | Comp.Ex 6 | Comp.Ex 7 |
|---|---|---|---|---|---|---|---|---|---|---|---|---|---|---|
| Styrene resin (A) | SEBS(H1221) (Weight parts) | 20 | 20 | 20 | 20 | 20 | 20 | | 20 | 20 | 20 | 20 | 20 | |
| | SEBS(H1062) (Weight parts) | | | | | | | 20 | | | | | | 20 |
| Hardness adjuster (B) | Random polypropylene (b1) (weight parts) | 2.1 | 2.1 | 2.3 | 2.0 | 2.1 | 4.2 | | | | | 5.3 | | 0.5 |
| | Propylene elastomer (b2) (Weight parts) | 11.9 | 11.9 | 12.8 | 11.1 | 11.9 | 9.8 | | | | | 29.8 | | 2.5 |
| | Polypropylene (NP055) (Weight parts) | | | | | | | 7 | 7 | | | | | |
| | Polyethylene (NL100) (Weight parts) | | | | | | | | | | | | | |
| | Ethylene-butene copolymer (Weight parts) | | | | | | | | | | 10 | | | |
| Softener (C) | Polybutene (30N) (Weight parts) | 40 | 20 | 40 | 20 | | 42 | 30 | 30 | 40 | 40 | 40 | | 40 |
| | Polybutene (G12000) (Weight parts) | | | | | 40 | | | | | | | | |
| Tackifier (D) | ARKON (P100) (Weight parts) | 20 | 30 | 20 | 50 | 50 | 23 | 20 | 30 | 20 | 20 | 20 | | 20 |
| | Total (Weight parts) | 94 | 84 | 95.1 | 103.1 | 124 | 99 | 77 | 87 | 80 | 90 | 115.1 | | 83.1 |
| | Hardness adjuster (B)/Styrene resin (A) (%) | 70.0 | 70.0 | 75.5 | 65.5 | 70.0 | 70.0 | 35.0 | 35.0 | 0.0 | 50.0 | 175.5 | | 15.5 |
| | (b1)/{(b1)+(b2)} | 0.15 | 0.15 | 0.15 | 0.15 | 0.15 | 0.3 | — | — | — | — | 0.15 | | 0.15 |
| Observation by transmission electron microscope | Absence or presence of three-phase structure | ○ | ○ | ○ | ○ | ○ | ○ | × | × | × | × | × | × | × |
| | Area ratio of island phases in three-phase structure (%) | 36 | 29 | 37 | 22 | 11 | 35 | 0 | 0 | 0 | 0 | 0 | 0 | 0 |
| | Is area ratio of island phases in three-phase structure 10% to less than 40%? | ○ | ○ | ○ | ○ | ○ | ○ | × | × | × | × | × | × | × |
| Dynamic viscoelasticity | Peak temperature of Tan δ (°C) | −15 | 7 | −6 | 27 | 17 | −13 | −15 | −14 | −19 | −13 | −15 | −16 | −14 |
| | Maximum value of Tan δ | 1.7 | 1.7 | 1.7 | 2 | 1.8 | 1.7 | 1 | 1 | 1.2 | 2 | 1.1 | 1.4 | 1.7 |
| | Is maximum value of Tan δ 1.5 to 5? | ○ | ○ | ○ | ○ | ○ | ○ | × | × | × | ○ | × | ○ | ○ |
| | Storage elastic modulus at 25°C (×10⁶ Pa·s) | 4.4 | 7.2 | 4.7 | 28 | 6.2 | 4.3 | 15 | 4.2 | 8.4 | 3.1 | 2.0 | 9.7 | 3.2 |
| | Is storage elastic modulus at 25°C 4.1×10⁶Pa·s to 1×10⁸Pa·s? | ○ | ○ | ○ | ○ | ○ | ○ | × | ○ | ○ | × | × | ○ | × |
| Infrared absorption spectrum | Presence or absence of butene peak at 761cm⁻¹ to 767cm⁻¹ | ○ | ○ | ○ | ○ | ○ | ○ | × | × | × | ○ | ○ | ○ | ○ |
| Evaluation | Position deviation amount of patterns (nm) | 2 | 2 | 2 | 2 | 2 | 2 | 10 | 9 | 7 | 2 | 8 | 6 | 2 |
| | | Good | Good | Good | Good | Good | Good | Poor | Poor | Poor | Good | Poor | Poor | Good |
| | Distortion amount of mask (nm) | 102 | 104 | 105 | 98 | 100 | 103 | 300 | 280 | 230 | 102 | 250 | 200 | 100 |
| | Adhesive residue | None | None | None | None | None | None | None | None | None | Large | Large | None | Large |
| | Handling | Good | Good | Good | Good | Good | Good | Poor | Good | Good | Poor | Poor | Good | Poor |

FIG.4

PELLICLE AND MASK ADHESIVE THEREFOR

TECHNICAL FIELD

The present invention relates to a pellicle that is mounted on a lithography mask during exposure of manufacturing processes of semiconductor devices such as LSIs and super LSIs or liquid crystal display panels, and a mask adhesive for the pellicle. In particular, the present invention relates to a pellicle and a mask adhesive therefor that are suitable for forming fine patterns on a semiconductor device especially by double patterning.

BACKGROUND ART

In the manufacturing processes of semiconductor devices such as LSIs and super LSIs or liquid crystal display panels, light is applied via a mask (also referred to as exposure master plate or reticle) to print patterns. At this time, if particles are present on the mask, light is absorbed or bent by the particles. For this reason, the pattern is deformed or the edge is rugged, impairing the size, quality, and appearance of the pattern. Therefore, a method is employed for preventing particles from adhering to the mask surface by mounting a pellicle with good light transmittance.

Generally, a pellicle includes a metal pellicle frame and a pellicle membrane stretched across one end surface of the pellicle frame. A mask adhesive layer for securing a pellicle on a mask is arranged on the other end surface of the pellicle frame, and the mask adhesive layer is protected by, for example, a sheet-shape material (separator) which is releasable.

To mount the pellicle on the mask, the releasable sheet-shape material is peeled off and then the exposed mask adhesive layer is pressed against the predetermined position of the mask, to secure the pellicle on the mask. By mounting the pellicle on the mask in this way, an exposure light can be transmitted without the influences of particles or the like.

A pellicle using an acrylic emulsion adhesive as a mask adhesive, is suggested (for example, see Patent Literature 1). Surface protection films for optical usages containing polypropylene elastomers and/or styrene elastomers as a thickening agent layer, are suggested (for example, see Patent Literature 2). Dicing substrate films containing hydrogen additives of styrene-butadiene copolymers (SEBS), polypropylene resins (PP) and olefin thermoplastic elastomers (TPO) as a substrate layer, are suggested (for example, see Patent Literature 3). Resin compositions having a salami-like dispersed structure are suggested, the resin compositions containing the continuous phase of a modified polyphenylene sulfide (PPS) resin and the discontinuous phase of polyester as resin compositions having a phase-separated structure; and the discontinuous phase of the polyester further includes the continuous phase of epoxide-containing polyolefin and the discontinuous phase of other polyolefins (for example, see Patent Literature 4).

Microfabrication of pattern is required for high-integration of semiconductor devices. That is, to achieve high integration of semiconductor devices in a narrow area, it is necessary to minimize semiconductor devices. For this reason, it is necessary to make the width of the pattern and the pitch, which means an interval of the neighboring patterns, smaller. However, microfabrication of the pattern has a limitation due to resolution limitation.

One of the methods for overcoming the resolution limitation in the photolithography process is double patterning. Double patterning is a technique for obtaining two circuit patterns of low density by exposure, and combining these two patterns to obtain a fine pattern of high density (for example, see Patent Literatures 5 and 6). Double patterning is preferably applied to manufacture of semiconductors of the next generation of 22 nm generation (half pitch 32 nm) and subsequent generations.

In double patterning, exposure is performed twice using two masks. For this reason, accuracy of relative positions of the two patterns is important. That is, when the accuracy of the relative positions of a pattern obtained by the first exposure and a pattern obtained by the second exposure is not high, the desired pattern cannot be obtained. Therefore, it is desirable to minimize the deviation of nm level related to relative positions of the two patterns (position deviation of patterns).

CITATION LIST

Patent Literature

PTL 1
Japanese Patent Application Laid-Open No. 2007-156397
PTL 2
Japanese Patent Application Laid-Open No. 2008-115212
PTL 3
Japanese Patent Application Laid-Open No. 2008-159701
PTL 4
Japanese Patent Application Laid-Open No. 2004-352755
PTL 5
Japanese Patent Application Laid-Open No. 2008-103718
PTL 6
Japanese Patent Application Laid-Open No. 2008-103719

SUMMARY OF INVENTION

Technical Problem

The present inventors considered that the position deviation of patterns occurs in double patterning partly because of distortion of a mask, and the mask distortion occurs when the mask is distorted in line with distortion of the pellicle frame via the mask adhesive layer while pressing the pellicle against the mask.

In order to prevent the mask from being distorted in line with distortion of the pellicle frame, it is effective to soften the mask adhesive layer to be easily deformed to alleviate distortion energy of the pellicle frame. However, a too soft mask adhesive layer tends to be easily deformed or distorted when the mask adhesive is touched by operators or is made contact with machines during manufacturing of pellicles or mounting the mask adhesive on the mask, or when the mask adhesive is made contact with the end surface of a case of pellicles when the case is translated. As a result, there is a likelihood that the mask is distorted in line with distortion of the mask adhesive.

Further, when the mask adhesive is too soft, an adhesive residue tends to remain on the mask surface, when peeling the pellicle frame off from the mask after completion of the exposure process. Further, because the instant adhesive property of the too soft mask adhesive layer is high, the mask adhesive tends to be sticky when being touched by a hand, and the handling of the mask adhesive is hard to do operation.

In order to improve accuracy of patterning, in particular to prevent position deviation of patterns in double patterning, it is desired that the mask adhesive has appropriate softness so as not to allow the mask to be distorted in line with distortion of the pellicle frame. And also, it is desired that after the pellicle frame is peeled off from the mask, a residue of the mask adhesive on the mask is reduced. In addition, it is required that handling characteristics of the mask adhesive is good. It is therefore an object of the present invention to provide a pellicle including a mask adhesive layer having appropriate softness and having less adhesive residue after the pellicle frame is peeled off from the mask. And thus, good handling characteristics can be achieved. And in particular, a pellicle that can prevent position deviation of patterns in double patterning can be provided.

Solution to Problem

The present invention relates to a pellicle and a mask adhesive used for the pellicle given below.

[1] A pellicle comprising:
a pellicle frame;
a pellicle membrane disposed on one end surface of the pellicle frame; and
a mask adhesive layer disposed on other end surface of the pellicle frame,
wherein the mask adhesive layer contains 35 to 170 weight parts of a hardness adjuster (B) containing a polypropylene (b1) and a propylene based elastomer (b2) per 100 weight parts of a styrene resin (A); and
in an electron microscopic photograph of the mask adhesive layer, a phase-separated structure of a continuous phase of the styrene resin (A) and a discontinuous phase of the hardness adjuster (B) is observed.

[2] The pellicle according to [1], wherein the discontinuous phase of the hardness adjuster (B) includes a continuous phase of the polypropylene (b1) and a discontinuous phase of the propylene based elastomer (b2).

[3] The pellicle according to any one of [1] and [2], wherein a maximum value of tan δ in dynamic viscoelasticity of the mask adhesive layer is 1.5 to 5, and storage elastic modulus of the mask adhesive layer at 25° C. is $4.1 \times 10^5$ Pa·s to $1 \times 10^9$ Pa·s.

[4] The pellicle according to any one of [1] to [3], wherein a mass ratio of the polypropylene (b1) to the propylene based elastomer (b2) is 10:90 to 30:70.

[5] The pellicle according to any one of [1] to [4], wherein the mask adhesive layer has an absorption peak in a region of 761 $cm^{-1}$ to 767 cm in an infrared absorption spectrum.

[6] The pellicle according to any one of [1] to [5], wherein
the styrene resin (A) is a styrene-ethylene-butylene-styrene copolymer,
the polypropylene (b1) is homopolypropylene or random polypropylene containing 5 mol % or less of a comonomer component; and
the propylene based elastomer (b2) is a propylene-butene-ethylene copolymer.

[7] A mask adhesive for securing a pellicle on a mask, the mask adhesive comprising;
35 to 170 weight parts of a hardness adjuster (B) containing a polypropylene (b1) and a propylene based elastomer (b2) per 100 weight parts of a styrene resin (A);
wherein, in an electron microscopic photograph, a phase-separated structure containing a continuous phase of the styrene resin (A) and a discontinuous phase of the hardness adjuster (B) is observed.

[8] The mask adhesive according to [7], wherein the discontinuous phase of the hardness adjuster (B) contains a continuous phase of the polypropylene (b1) and a discontinuous phase of the propylene based elastomer (b2).

[9] The mask adhesive according to any one of [7] and [8], wherein a maximum value of tan δ in dynamic viscoelasticity is 1.5 to 5, and a storage elastic modulus at 25° C. is $4.1 \times 10^5$ Pa·s to $1 \times 10^9$ Pa·s.

[10] The mask adhesive according to any one of [7] to [9], wherein a mass ratio of the polypropylene (b1) to the propylene based elastomer (b2) is 10:90 to 30:70.

[11] The mask adhesive according to any one of [7] to [10], wherein the mask adhesive has an absorption peak in a region of 761 $cm^{-1}$ to 767 $cm^{-1}$ in an infrared absorption spectrum.

[12] The mask adhesive according to any one of [7] to [11], wherein:
the styrene resin (A) is a styrene-ethylene-butylene-styrene copolymer,
the polypropylene (b1) is homopolypropylene or a random polypropylene containing 5 mol % or less of a comonomer component; and
the propylene based elastomer (b2) is a propylene-butane-ethylene copolymer.

Effects of Invention

The pellicle according to the present invention includes a mask adhesive layer having appropriate softness so as not to be deformed or distorted and having less adhesive residue after a pellicle frame is peeled off from a mask. And therefore, good handling characteristics can be achieved. By this means, position deviation of patterns can be prevented in double patterning.

BRIEF DESCRIPTION OF DRAWINGS

FIG. 4 is a table showing results of Examples and Comparative Examples.

DESCRIPTION OF EMBODIMENTS

1. Mask Adhesive

Figure 1:
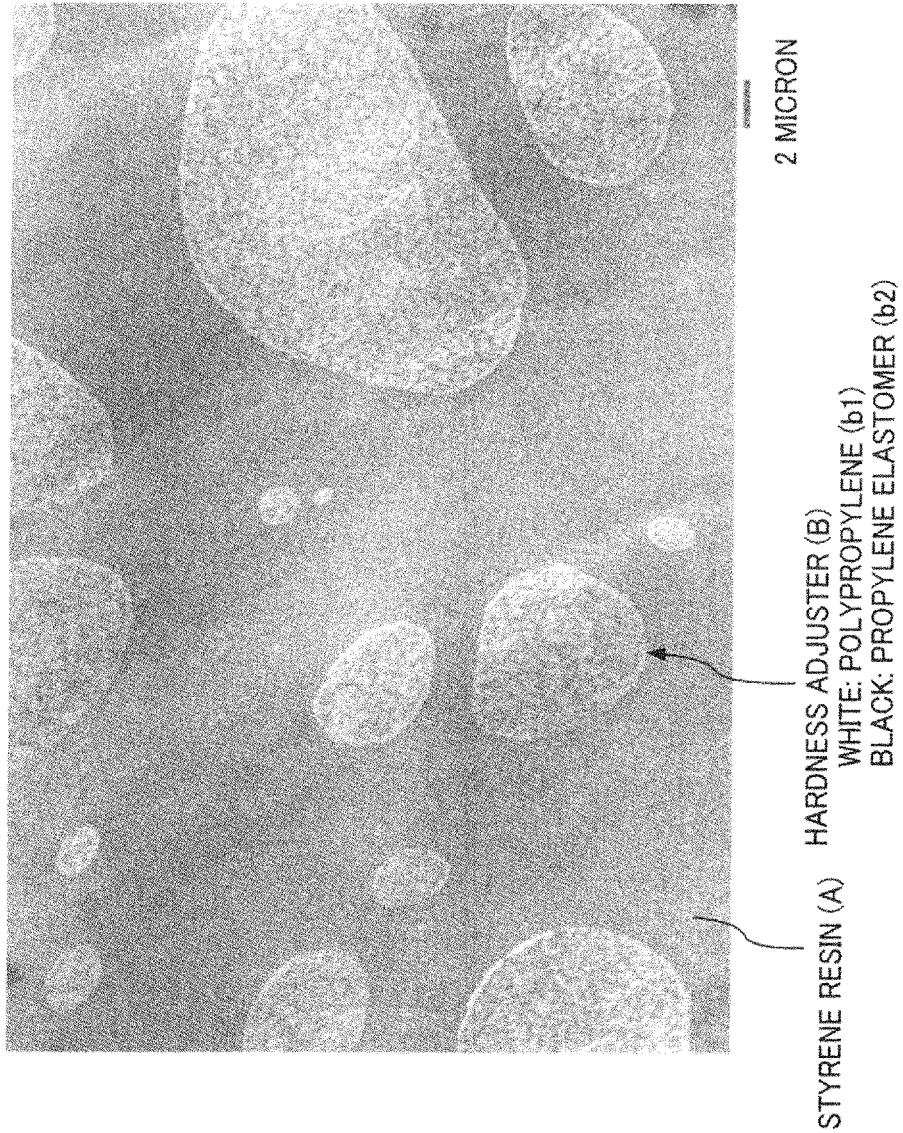
FIG. 1 is a transmission electron microscopic photograph of one example of a mask adhesive layer according to the present invention.

The mask adhesive according to the present invention contains a styrene resin (A) and a hardness adjuster (B) containing a polypropylene (b1) and a propylene based elastomer (b2), and, if necessary, a softener (C) and a tackifier (D).

The styrene resin (A) is a polymer containing styrene-derived units, and is preferably a copolymer of styrene and olefin other than styrene. The styrene resin (A) is preferably a copolymer of styrene and one type of olefin, or a terpolymer of styrene and two types of olefins. Examples of olefins include ethylene, propylene, butene, octene, and hexene.

Examples of the styrene resin (A) include a styrene-ethylene-butylene-styrene copolymer (also referred to as "SEBS") and a styrene-isoprene-styrene copolymer, with a styrene-ethylene-butylene-styrene copolymer preferred. The styrene resin (A) can enhance mainly elasticity of the mask adhesive.

The maximum value of tan δ in dynamic viscoelasticity of the styrene resin (A) is preferably large. Tan θ is represented by loss elastic modulus/storage elastic modulus. A larger maximum value of tan δ means that plastic deformation can occur easily. The styrene resin (A) having a larger maximum value of tan δ allows mask adhesives containing the styrene resin (A) to undergo plastic deformation easily and to be less distorted. The maximum value of tan δ of the styrene resin (A) is preferably 1 to 4 and more preferably 1.4 to 4.

Tan δ in the dynamic viscoelasticity and the storage elastic modulus may be measured by the dynamic viscoelastmeter, RSA-II (TA Instruments). Specifically, the storage elastic modulus, the loss elastic modulus and tan δ of a sample strip (width 5 mm×thickness 1 mm) of the styrene resin (A) are measured in a nitrogen atmosphere, with a tension mode, 1 Hz, at a measurement temperature of −80 to 120° C., at a heating rate of 3° C./min, and with the initial gap being set to 20 mm.

The content of a styrene-derived unit in the styrene resin (A) is preferably 35 mass % or less and more preferably 20 mass % or less. This is because too much content of the styrene-derived unit makes tan δ of the styrene resin (A) too small.

A solubility parameter (SP value) of the styrene resin (A) is preferably 15.5 $(J/cm^3)^{1/2}$ to 17.5 $(J/cm^3)^{1/2}$, and more preferably 16 $(J/cm^3)^{1/2}$ to 17 $(J/cm^3)^{1/2}$, in order to improve compatibility of the styrene resin (A) with the hardness adjuster (B) (described later). The solubility parameter (SP value) of the styrene resin (A) can be adjusted by the composition. Specifically, the solubility parameter (SP value) can be controlled by the content of the styrene-derived unit, and the content is preferably 35 mass % or less. This is because too much content of the styrene-derived unit causes the excessive increase in the solubility parameter.

The solubility parameter (SP value) is a value defined by Hildebrand based on the regular solution theory. A smaller difference of the SP value between the two components to be mixed means that compatibility of the two components is higher. An SP value can be obtained by the known method (described in R. F. Fedors, polym. Eng. Sci., 14(2), pages 147-154 (1974)).

The hardness adjuster (B) contains a polypropylene (b1) and a propylene based elastomer (b2).

The polypropylene (b1) is homopolypropylene or random polypropylene containing a small amount of a comonomer.

The comonomer in random polypropylene is preferably olefins other than propylene. Examples of olefins other than propylene include ethylene, butene, pentene, hexene, octene, and decene. These olefins may be used alone or in combination.

The content of a comonomer in random polypropylene is preferably 10 mol % or less and more preferably 5 mol % or less. When random polypropylene contains multiple types of comonomers, the total comonomer is 10 mol % or less, and preferably 5 mol % or less.

Preferred examples of the polypropylene (b1) include polypropylene or random polypropylene having content of 90 mol % to 100 mol % of the propylene-derived unit, and content of 0 mol % to 5 mol % of the ethylene-derived unit; and content of 0 mol % to 5 mol % of the butane-derived unit.

Because the polypropylene (b1) has good compatibility with either of the styrene resin (A) and the propylene based elastomer (b2), the polypropylene (b1) can enhance compatibility of the styrene resin (A) with the propylene based elastomer (b2) and can form a sea-island structure. That is, because the polypropylene (b1) is a resin having high elastic modulus, phases are separated to constitute the sea-island structure in which the polypropylene (b1) forms island phases with respect to a sea phase of the styrene resin (A). In this case, the presence of the polypropylene (b1) keeps high elasticity derived from the polypropylene (b1) even after the polypropylene (b1) is mixed with the styrene resin (A). For this reason, the polypropylene (b1) can enhance the elasticity of the mask adhesive and prevent an adhesive residue from remaining on the mask, and thus improve the handling of the mask adhesive.

The storage elastic modulus of the polypropylene (b1) at 25° C. is preferably $4.1 \times 10^5$ Pa·s to $1 \times 10^{11}$ Pa·s and more preferably $5 \times 10^5$ Pa·s to $1.5 \times 10^9$ Pa·s. A too high storage elastic modulus of the polypropylene (b1) may make the maximum value of tan δ of the mask adhesive small. The storage elastic modulus can be measured by the same method as described above.

The tensile elastic modulus of the polypropylene (b1) is preferably 1,500 MPa to 1,800 MPa, and more preferably 1,600 MPa to 1,800 MPa. The tensile elastic modulus can be measured in accordance with JIS K7161.

The bend elastic modulus of the polypropylene (b1) is preferably 1,100 MPa to 2,000 MPa, and more preferably 1,200 MPa to 2,000 MPa. The bend elastic modulus can be measured in accordance with JIS K7171.

The density of the polypropylene (b1) is preferably 900 $kg/m^3$ to 930 $kg/m^3$, and more preferably 903 $kg/m^3$ to 930 $kg/m^3$. The density can be measured in accordance with JIS K0061.

The solubility parameter (SP value) of the polypropylene (b1) is preferably 14 $(J/cm^3)^{1/2}$ to 18.4 $(J/cm^3)^{1/2}$, more preferably 15 $(J/cm^3)^{1/2}$ to 17 $(J/cm^3)^{1/2}$, further more preferably 15.5 $(J/cm^3)^{1/2}$ to 16.8 $(J/cm^3)^{1/2}$, and particularly preferably 16 $(J/cm^3)^{1/2}$ to 16.4 $(J/cm^3)^{1/2}$, in order to enhance compatibility of the polypropylene (b1) with the styrene resin (A) and the propylene based elastomer (b2). The solubility parameter (SP value) can be measured by the same method as described above. When the polypropylene (b1) is random polypropylene, the solubility parameter (SP value) of random polypropylene can be adjusted by the type or content of a comonomer.

The polypropylene (b1) may be manufactured or may be a commercial product.

The propylene based elastomer (b2) is an elastomer containing a unit derived from propylene, and preferably a copolymer containing a unit derived from propylene and a unit derived from en. A preferred example of en is 1-butene. This is because, among ens, 1-butene has an effect to increase the maximum value of tan δ. A preferred example of the propylene based elastomer (b2) containing a propylene-derived unit and a 1-butene-derived unit is a propylene-butene-ethylene copolymer (PBER).

In the propylene-butene-ethylene copolymer, the content of the ethylene-derived unit is preferably 5 mol % to 20 mol %, and the content of the 1-butene-derived unit is preferably 5 mol % to 30 mol %. The propylene-butene-ethylene copolymer containing many 1-butene-derived units can increase the maximum value of tan δ of the mask adhesive. As described above, the propylene based elastomer (b2) has the good compatibility with the polypropylene (b1), and thus can increase the maximum value of tan δ of the mask adhesive.

There is an absorption peak in the region of 761 $cm^{-1}$ to 767 $cm^{-1}$ in the infrared absorption spectrum of the propylene based elastomer (b2). This absorption peak of 761 $cm^{-1}$ to 767 $cm^{-1}$ is a absorption peak of the normal 1-butene-derived unit (absorption of rocking bending vibration of $CH_2$ derived from 1-butene). The propylene based elastomer (b2) having the absorption peak in this region is compatible with the polypropylene (b1), and can increase the maximum value of tan δ of the hardness adjuster (B). This absorption peak can be confirmed in the infrared absorption spectrum of a copolymer containing a 1-butene-derived unit as well as in the infrared absorption spectrum of the mask adhesive containing the copolymer containing a 1-butene-derived unit.

The maximum value of tan δ of the propylene based elastomer (b2) is preferably 0.6 to 4, more preferably 0.8 to 4, further preferably 1 to 4.

The storage elastic modulus of the propylene based elastomer (b2) at 25° C. is $1\times10^2$ Pa·s to $1\times10^7$ Pa·s, and preferably $1\times10^3$ Pa·s to $1\times10^6$ Pa·s. A mask adhesive containing the propylene based elastomer (b2) having too high storage elastic modulus is not only less likely to be in close contact with the mask, but also makes the maximum value of tan δ too small, and therefore is not preferable.

The density of the propylene based elastomer (b2) is preferably 800 kg/m$^3$ to 900 kg/m$^3$, and more preferably 805 kg/m$^3$ to 900 kg/m$^3$.

The solubility parameter (SP value) of the propylene based elastomer (b2) is preferably 14 $(J/cm^3)^{1/2}$ to 18.4 $(J/cm^3)^{1/2}$, more preferably 15 $(J/cm^3)^{1/2}$ to 17 $(J/cm^3)^{1/2}$, further preferably 15.5 $(J/cm^3)^{1/2}$ to 16.8 $(J/cm^3)^{1/2}$, especially preferably 16 $(J/cm^3)^{1/2}$ to 16.4 $(J/cm^3)^{1/2}$, in order to enhance the compatibility of the propylene based elastomer (b2) with the styrene resin (A) and the polypropylene (b1). The solubility parameter (SP value) can be measured by the same method as described above. The solubility parameter (SP value) of the propylene based elastomer (b2) can be adjusted by the type or content of a comonomer. For example, when the content of ethylene and butylene or the like in the comonomer is increased, the solubility parameter decreases; and in contrast, when the content of ethylene and butylene or the like is decreased, the solubility parameter increases.

The polypropylene (b1) and the propylene based elastomer (b2) may be manufactured or may be a commercial product.

When polyethylene, polyethylene wax, polypropylene, polypropylene wax and the like, each of which has high elasticity, instead of the above-described hardness adjusters (B), are contained in the mask adhesive, the mask adhesive will show high elasticity, but will have a smaller maximum value of tan δ depending on how much such component having high eleasticity is added to the mask adhesive. For this reason, a mask adhesive for achieving a high elastic modulus and the large maximum value of tan δ at the same time cannot be obtained. On the other hand, when an elastomer having low elasticity (for example, ethylene-butene copolymer) is contained in a mask adhesive, the mask adhesive will show low eleasticity, and thus will allow an adhesive residue and the like to remain easily on the mask.

The content ratio (mass ratio) of the polypropylene (b1) to the propylene based elastomer (b2) in the hardness adjuster (B) is preferably 5:95 to 30:70, and more preferably 10:90 to 30:70. When the content ratio (mass ratio) of the polypropylene (b1) to the propylene based elastomer (b2) is in the above range, a sea-island structure in which island phases of the propylene based elastomer (b2) are dispersed in a sea phase of the polypropylene (b1) (described later) can be likely to be obtained.

The maximum value of tan δ in dynamic viscoelasticity of the hardness adjuster (B) is preferably 0.5 to 2, and more preferably 0.7 to 2. The hardness adjuster (B) having the maximum value of tan δ in the above range allows the mask adhesive containing the hardness adjuster (B) to undergo plastic deformation appropriately and prevents that mask adhesive from being distorted.

The storage elastic modulus of the hardness adjuster (B) at 25° C. is $0.9\times10^5$ Pa·s and, more preferably $1\times10^5$ Pa·s to $1\times10^7$ Pa·s. The hardness adjuster (B) having the storage elastic modulus in the above range can prevent the residue of the mask adhesive containing the hardness adjuster (B) from remaining on the mask and prevent the handling of that mask adhesive from being impaired.

The mask adhesive may contain a softener (C). A material of the softener (C) is not limited as long as it can provide flexibility to the styrene resin (A). Preferred examples of the softener (C) include polybutene, hydrogenated polybutene, and unsaturated polybutene.

The mask adhesive may contain a tackifier (D). A material of the tackifier (D) is not limited as long as it is generally used. Examples of the tackifier (D) includes ARKON (Arakawa Chemical Industries, Ltd.), TOHO HIGH-RESIN and TOHO CORPOREX (TOHO Chemical Industry Co., Ltd.), Hirez (Mitsui Chemicals, Inc.), QUINTONE (Zeon Corporation), and ESCOLETS® (Tornex). Among those, petroleum resins such as a pentene-derived fraction (C5 fraction) or a nonene-derived fraction (C9 fraction) are preferable. In particular, the nonene-derived fraction (C9 fraction, for example, ARKON) is preferable because it has a good compatibility with the styrene resin (A) such as SEBS.

The mask adhesive contains 35 to 170 weight parts of the hardness adjuster (B), preferably 65 to 76 weight parts, per 100 weight parts of the styrene resin (A).

A too large content of the hardness adjuster (B) leads to too high stiffness, decreasing the maximum value of tan δ of the mask adhesive. For this reason, the effect to reduce the position deviation of patterns is hard to be obtained. Too small content of the hardness adjuster (B) makes the mask adhesive too soft, allowing the adhesive residue to remain on the mask and impairing the handling of the mask adhesive.

The mask adhesive of the present invention can be obtained by mixing or kneading respective above components at 80° C. to 220° C. A mixer/kneader may be general equipment, and, for example, a twin-screw extruder, Labo PlastoMill, or a mixer may be used.

Thus obtained maximum value of tan δ in dynamic viscoelasticity of the mask adhesive is preferably appropriately high, more preferably 1.5 to 5, further preferably 1.7 to 4. The mask adhesive having the large maximum value of tan δ undergoes plastic deformation easily (which means soft), and thus can release the distortion energy of the pellicle frame to prevent the mask from being distorted in line with distortion of the pellicle frame. However, the mask adhesive having the too large maximum value of tan δ has too low elasticity, lowering hardness of the resin itself and allowing the adhesive residue to remain on the mask. The hardness adjuster (B) having a maximum value of tan δ in the above range allows appropriately plastic deformation of the mask adhesive containing the hardness adjuster (B), preventing the mask from being distorted (for example, the amount of position deviation of patterns can be made 3 nm or less in double patterning) while preventing the adhesive residue from remaining on the mask.

Tan δ preferably becomes the maximum value (tan δ of peak temperature) at a temperature of −80° C. to 30° C. This is because operations including mounting of a pellicle on the mask is performed at normal temperature, and therefore plastic deformation generated at normal temperature or lower is important for present invention. The measurement frequency is 1 Hz.

To increase the maximum value of tan δ of the mask adhesive, it is only necessary to raise the content ratio (mass ratio) of the propylene based elastomer (b2), and to decrease the maximum value of tan δ of the mask adhesive, it is only necessary to lower the content ratio (mass ratio) of the propylene based elastomer (b2). However, when the content ratio (mass ratio) of the propylene based elastomer (b2) is raised too much, the maximum value of tan δ of the mask adhesive may be decreased. Therefore, it is necessary to set the proper content ratio.

The storage elastic modulus of the mask adhesive at 25° C. is preferably $4.1 \times 10^5$ Pa·s to $1 \times 10^9$ Pa·s, more preferably $4.2 \times 10^5$ Pa·s to $1 \times 10^7$ Pa·s, Because a mask adhesive having high storage elastic modulus has large cohesive strength, an adhesive residue is unlikely to remain on a mask and thus the handling characteristics of the mask adhesive is improved. On the other hand, a mask adhesive having low storage elastic modulus allows an adhesive residue to remain on the mask easily, impairing handling characteristics.

To raise the storage elastic modulus of the mask adhesive, it is only necessary to raise the content ratio (mass ratio) of the polypropylene (b1), and to lower the storage elastic modulus of the mask adhesive, it is only necessary to lower the content ratio (mass ratio) of the polypropylene (b1).

Tan δ and the storage elastic modulus of the mask adhesive can be measured by the same method as described above.

The mask adhesive of the present invention includes a sea-island structure (phase-separated structure) in which the island phases (discontinuous phases) of the hardness adjuster (B) are dispersed in the sea phase (continuous phase) of the styrene resin (A). The island phase of the hardness adjuster (B) further includes a sea-island structure (phase-separated structure) in which the island phases (discontinuous phase) of the propylene based elastomer (b2) are dispersed in the sea phase (continuous phase) of the polypropylene (b1). These phase-separated structures can be observed by transmission electron microscopy.

FIG. 1 is a transmission electron microscopic photograph of one example of a mask adhesive according to the present invention. FIG. 1 shows a three-phase structure in which the island phases of the hardness adjuster (B) are dispersed in the sea phase of the styrene resin (A); and each of the island phases of the hardness adjuster (B) includes the sea phase (white part) of the polypropylene (b1) and the island phases (black part) of the propylene based elastomer (b2).

The sea-island structure of the styrene resin (A) and the hardness adjuster (B) can be obtained when the styrene resin (A) and the hardness adjuster (B) have high compatibility between each other and are contained in proper ratios. Likewise, the sea-island structure of the polypropylene (b1) and the propylene based elastomer (b2) in the island phase of the hardness adjuster (B) can be obtained when the polypropylene (b1) and the propylene based elastomer (b2) have high compatibility between each other and are contained in proper ratios.

That is, the three-phase sea-island structure as shown in FIG. 1 can be obtained when the styrene resin (A), the polypropylene (b1), and the propylene based elastomer (b2) have high compatibility one another and are contained in proper ratios. When the compatibility between the polypropylene (bit) and the propylene based elastomer (b2) is low, the two components are less likely to mix with each other. For this reason, the island phases of the polypropylene (b1) and the island phases of the propylene based elastomer (b2) are separately dispersed in the sea phase of the styrene resin (A), not forming the above-described three-phase structure.

Generally, the sea-island structure (phase-separated structure) can be obtained by mixing two or more components having high compatibility, and when the compatibility between two of the components are in particular high, the diameter of the island phase becomes smaller (island phases are finely dispersed). On the other hand, mixing two or more components having low compatibility only causes phase separation and does not form a sea-island structure. Mixing the same substances leads to complete dissolution to form a single phase and does not form the sea-island structure, either.

To enhance the compatibility among the styrene resin (A), the polypropylene (b1), and the propylene based elastomer (b2), it is preferable to select such components having the solubility parameter (SP value) close to one another.

The sea-island structure can be observed by transmission electron microscopic photograph. When observing the sea-island structure with a transmission electron microscope, it is preferable to stain the mask adhesive with ruthenium tetra oxide. This is because the polypropylene (b1), which is crystalline, is not stained and only the propylene based elastomer (b2), which is amorphous, is stained with ruthenium, allowing easy observation of the three-phase structure.

The ratio of an area (area ratio) for which the island phases of the hardness adjuster (B) account in the entire area of the mask adhesive that is observed using a transmission electron microscope (observation area of $1{,}350\ \mu m^2$ and 5.000-fold magnification) is preferably 10% to less than 40%, and more preferably 15% to less than 35%. The mask adhesive having this area ratio has a proper maximum value of tan δ and storage elastic modulus.

The area ratio of the island phases of the hardness adjuster (B) can be adjusted by the content ratio of the styrene resin (A) to the hardness adjuster (B). When the content of the hardness adjuster (B) is large, the area of the island phase of hardness adjuster (B) with respect to the entire mask adhesive area becomes large; and when the content of the hardness adjuster (B) is small, the area of the island phase of the hardness adjuster (B) with respect to the entire mask adhesive area becomes small. That is, the above area ratio can be obtained when 35 to 170 weight parts of the hardness adjuster (B) is contained per 100 weight parts of the styrene resin (A).

The area ratio of the island phases of the hardness adjuster (B) can be measured using a photograph of the sea-island structure photographed by a transmission electron microscopy or the like.

The diameter of the island phase is around 1 to 14 μm, for example. The smaller diameter of the island phase is preferable because the smaller the diameter of the island phase the more finely the island phases are dispersed.

The mask adhesive of the present invention has appropriately large maximum value of tan δ and high storage elastic modulus, and therefore has appropriate softness. For this reason, when the mask adhesive of the present invention is used as a mask adhesive layer of a pellicle, the mask adhesive layer absorbs (alleviates) distortion of the pellicle so as to prevent the mask from being distorted in line with distortion of the pellicle and the mask adhesive layer. Further, the mask adhesive of the present invention does not tend to produce sticky strings and thus prevents an adhesive residue from remaining on the mask. Therefore, when being touched by a hand of an operator, the mask adhesive layer can be detached easily from the hand and thus the handling characteristic is improved.

2. Pellicle

Figure 2:
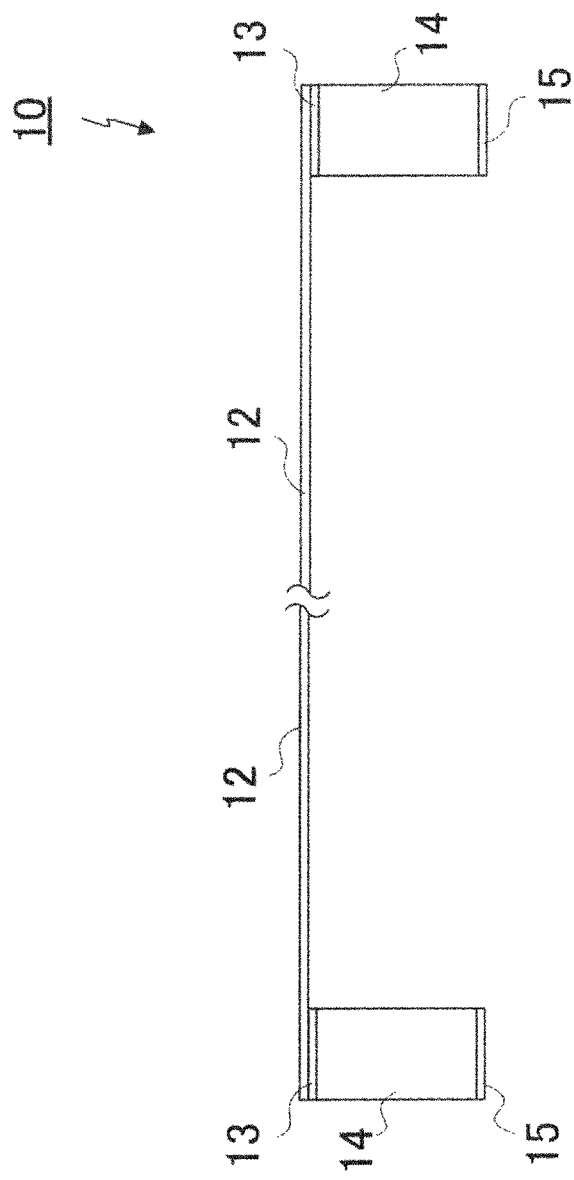
FIG. 2 is a schematic diagram of one example of a configuration of a pellicle according to the present invention.

A pellicle of the present invention includes a pellicle membrane, a pellicle frame supporting the circumference of the pellicle membrane, a film adhesive for adhering the pellicle membrane to the pellicle frame, and a mask adhesive for adhering the mask to the pellicle frame. FIG. 2 shows one example of a pellicle according to the present invention. Pellicle 10 includes pellicle membrane 12 and pellicle frame 14 supporting the circumference of pellicle membrane 12. Pellicle membrane 12 is stretched across pellicle frame 14 via membrane adhesive layer 13 disposed on one end surface of pellicle frame 14. On the other hand, in order to adhere pellicle frame 14 to a mask (not shown), mask adhesive layer 15 is disposed on the other end surface of pellicle frame 14. Mask adhesive layer 15 can be made of the above-described mask adhesive.

Pellicle membrane 12 is supported by pellicle frame 14, and covers the exposure area of a mask (not shown). Therefore, pellicle membrane 12 has translucency so as not to block the energy of exposure. Examples of material of pellicle membrane 12 include transparent materials such as quartz glass, fluorine resins, and acetic cellulose.

Pellicle frame 14 may be an anodized aluminum frame. Pellicle frame 14 is preferably black in order to prevent reflection of exposure light and allows for easy inspection for attached particles.

Membrane adhesive layer 13 adheres pellicle frame 14 to pellicle membrane 12. Examples of membrane adhesive layer 13 include an acrylic resin adhesive, an epoxy resin adhesive, a silicone resin adhesive, a fluorine polymer such as a fluorine silicone-contained adhesive.

Via mask adhesive layer 15, pellicle frame 14 adheres to a mask (not shown). Mask adhesive layer 15 can be obtained by applying and drying the above-described mask adhesive. The mask adhesive may be applied by any known methods, for example, by holding a spatula-form application nozzle to the end surface of the pellicle frame to discharge the mask adhesive through the nozzle. The thickness of mask adhesive layer 15 may be around 0.3 to 1.0 mm.

A releasable sheet (separator) may be arranged on the surface of mask adhesive layer 15 to protect mask adhesive layer 15. Examples of a releasable sheet include a polyethylene terephthalate film and a polypropylene film. The releasable sheet is peeled off just before mounting the pellicle on the mask.

Pellicle 10 is mounted on the mask (not shown) via mask adhesive layer 15 after the releasable sheet is peeled off. When being focused by exposure light, particles attached to the mask causes resolution failure on a wafer. For this reason, pellicle 10 is mounted so as to cover the exposure area of a mask (not shown). By this means, particles are prevented from being attached to the mask (not shown).

Pellicle 10 is mounted using the pellicle mounter (Matsushita Seiki Co., Ltd.). The pellicle and the mask are loaded on the pellicle mounter under normal temperature, and the pellicle is pressed against the mask. Although depending on the type of a mask, a mask may be pressed, for example, under room temperature, at a pressure of around 20 kgf/cm$^2$, for around three minutes.

The mask (not shown) consists of a glass substrate made of synthetic quartz or quartz glass, printed light shading film thereon. The light blocking film is a mono or multiple-layer structure film made of metal(s) such as Cr and MoSi. The mask thickness is around 0.6 cm, for example.

As exposure light used for lithography in the forming process of circuit patterns drawn on semiconductor devices, a short wavelength of exposure light is used such as an i-line of a mercury lamp (365 nm wavelength), a KrF excimer laser (248 nm wavelength), or an ArF excimer laser (193 nm wavelength).

As described earlier, the pellicle of the present invention includes the appropriately soft mask adhesive layer that produces less adhesive residue on the mask. For this reason, when a pellicle is mounted on a mask, the mask adhesive layer absorbs and alleviates the distortion energy of the pellicle so as to prevent the distortion energy of the pellicle from transmitting to the mask, and to prevent distortion of the mask. Therefore, it is possible to prevent patterning accuracy to be caused by the mask distortion from lowering. Further, when peeling the pellicle off from the mask, the adhesive residue is prevented from remaining on the mask, and thus the handling characteristics of the mask adhesive layer are improved.

Further, in double patterning, exposure is performed twice for each wafer using two masks. By combining two circuit patterns, a circuit pattern having a half pitch of the circuit pattern obtained by one mask can be obtained. The pitch of the circuit pattern obtained by double patterning is around 1 to 5 nm.

By using the double patterning technique, it is possible to expose a wafer using the fine circuit pattern required for the cutting-edge generation of the 32 nm node or below, for which exposure is difficult using only one mask. With this technique, it is important how correctly the circuit patterns formed by the first and second exposure are combined in accordance with the designed circuit diagram. By this means, in double patterning, it is required to minimize the deviation amount related to relative positions of two patterns (position deviation amount of patterns). The position deviation amount of patterns required for the generation of the 32 nm node or below is around 0 to 5 nm, and preferably around 0 to 3 nm.

The position deviation amount of two patterns means a difference between (i) and (ii), (i) being the measured distance between a pattern formed by the first exposure/development and a pattern formed by the second exposure/development, (ii) being a distance between the patterns as required by circuit design. The position deviation amount of two patterns can be measured by the following method. First, the first exposure is performed via a mask. Next, the second exposure is performed by displacing the mask for a predetermined amount from the position at which the first exposure has been performed. At this time, the distance between the patterns formed by the first exposure/development and the patterns formed by the second exposure/development is obtained by observation by scanning electron microscopy (SEM); and then the difference between the obtained distance and the distance required by the circuit design is defined as the position deviation amount of patterns.

As described above, in double patterning, it is necessary to minimize the deviation amount of relative positions of two patterns in the nm level, requiring high patterning accuracy. The pellicle of the present invention prevents the mask from being distorted in line with distortion of the pellicle, therefore it is in particular suitable for double patterning.

EXAMPLES

Hereinafter, the present invention will be described with reference to Examples and Comparative Examples. The scope of the present invention is not limited to these Examples and Comparative Examples. Components used in the Examples and Comparative Examples are shown below.

Example 1

SEBS shown below as a styrene resin (A), a mixture of the random polypropylene (b1) and a propylene-butene-ethylene copolymer (b2) shown below as a hardness adjuster (B), polybutene (NISSAN polybutene 30N, NOF Corporation) as a softener (C), and ARKON P100 (Arakawa Chemical Industries, Ltd.) as a tackifier (D), are measured and mixed with the compounding ratio (mass ratio) shown in Table 1 (FIG. 4) to a total of 48 g.

(A) Styrene Resin
SEBS (TOUGH TECH®H1221, Asahi Kasei Chemicals Corporation)
  Content of a styrene-derived unit: 12 mass %
  Maximum value of tan δ at −30° C.: 2.0
  Solubility parameter (SP value): 16.7 $(J/cm^3)^{1/2}$ (B) Hardness Adjuster A 15/85 (mass ratio) mixture of the random polypropylene (b1) and the propylene-butene-ethylene copolymer (b2).

Maximum value of tan δ at −20° C.: 1.0
Storage elastic modulus at 25° C.: $1.1 \times 10^7$ Pa·s
(b1) Random polypropylene (C2/C3 mol %=1/99)
Storage elastic modulus at 25° C.: $3 \times 10^7$ Pa·s
Tensile elastic modulus: 1,600 MPa
Density: 910 Kg/m$^3$
Solubility parameter (SP value): 16.2 $(J/cm^3)^{1/2}$
(b2) Propylene-butene-ethylene copolymer (C2/C3/C4 mol %=13/68/19)
Storage elastic modulus at 25° C.: $8 \times 10^6$ Pa·s
Solubility parameter (SP value): 16.2 $(J/cm^3)^{1/2}$ A mixture of above (A) to (D) is charged into LABO-PLASTO-MILL (60 ml) (Toyo Seiki Seisaku-sho, Ltd.) and sealed. Next, the mixture is kneaded at 200° C. and at 150 rpm for 20 minutes to obtain a bulk mask adhesive. Around 10 g of the obtained bulk mask adhesive is cut out and charged into a heating tank (tank temperature: 210° C.) to melt the mask adhesive.

Meanwhile, as a pellicle frame, an anodized aluminum frame having an external dimension of 149 mm×122 mm×5.8 mm and a frame thickness of 2 mm is prepared.

The above-described molten mask adhesive is discharged from a needle point communicating with the heating tank, to apply the mask adhesive on the end surface of the pellicle frame. The thickness of the obtained mask adhesive layer is 0.6 mm. Further, a separator is disposed on the mask adhesive layer.

Using a film adhesive, a pellicle membrane is attached on the end surface side of the pellicle frame without the mask adhesive layer being arranged to obtain a pellicle.

Examples 2 to 4

Mask adhesives are prepared in the same way as in Example 1 except for using different compounding ratios shown in Table 1. Pellicles are made using these mask adhesives in the same way as in Example 1.

Example 5

A mask adhesive is prepared in the same way as in Example 1 except for using polybutene (NISSO-PB hydrogen additive type PB resin GI2000, Nippon Soda Co., Ltd.) as a softener (C), and using the different compounding ratio shown in Table 1. A pellicle is made using this mask adhesive in the same way as in Example 1.

Example 6

The mask adhesive is prepared in the same way as in Example 1 except for using the different compounding ratio shown in Table 1. A pellicle is made using this mask adhesive in the same way as in Example 1.

Comparative Example 1

A mask adhesive is prepared in the same way as in Example 1 except for using the SEBS below as the styrene resin (A) and polyethylene (Hi-WAX NL100, Mitsui Chemicals, Inc.) as the hardness adjuster (B), and using the different compounding ratio shown in Table 1. A pellicle is made using this mask adhesive in the same way as in Example 1.

Styrene Resin (A)

SEBS (TOUGH TECH®H1062, Asahi Kasei Chemicals Corporation)
Content of a styrene-derived unit: 18 mass %
Maximum value of tan δ at −48° C.: 1.3
Solubility parameter (SP value): 16.8 $(J/cm^3)^{1/2}$ Comparative Examples 2 and 3

A mask adhesive is prepared in the same way as in Example 1 except for using SEBS (TOUGH TECH®H1062, Asahi Kasei Chemicals Corporation) as the styrene resin (A) and polypropylene (Hi-WAX NP055, Mitsui Chemicals, Inc.) as the hardness adjuster (B), and using the different compounding ratio shown in Table 1. A pellicle is made using this mask adhesive in the same way as in Example 1.

Comparative Example 4

A mask adhesive is prepared in the same way as in Example except for using SEBS (TOUGH TECH®111062, Asahi Kasei Chemicals Corporation) as the styrene resin (A) and not using the hardness adjuster (B). A pellicle is made using this mask adhesive in the same way as in Example 1.

Comparative Example 5

A mask adhesive is prepared in the same way as in Example 1 except for using an ethylene-butene copolymer (C2/C3 mol %=89/11) as the hardness adjuster (B) and using the different compounding ratio shown in Table 1. A pellicle is made using this mask adhesive in the same way as in Example 1.

Comparative Example 6

A mask adhesive is prepared in the same way as in Example 1 except for setting the total content of the hardness adjuster (B) to 35.1 weight parts. A pellicle is made using this mask adhesive in the same way as in Example 1.

Comparative Example 7

A mask adhesive is prepared in the same way as in Example except for using SEBS (TOUGH TECH®H1062, Asahi Kasei Chemicals Corporation) as the styrene resin (A) and setting the total content of the hardness adjuster (B) to 3.1 weight parts. A pellicle is made using this mask adhesive in the same way as in Example 1.

The mask adhesives prepared in Examples 1 to 6 and Comparative Examples 1 to 7 are evaluated for the following items: 1. Observation by transmission electron microscope, 2. Dynamic viscoelasticity, and 3. Infrared absorption spectrum). Further, pellicles having the above mask adhesives are evaluated for the following items: 4. Distortion amount of mask, 5. Position deviation amount of patterns, 6. Adhesive residue and handling characteristics. The results are shown in Table 1.

1. Observation by Transmission Electron Microscope

The frozen mask adhesive is cut by a microtome to obtain a thin section (0.1 μm thickness), which is then stained with ruthenium tetra oxide. This thin section is observed using the transmission electron microscope, H-7650 (Hitachi, Ltd.) (observation area of 1,350 μm$^2$ and 5,000-fold magnification). In Table 1, regarding whether or not the three-phase structure in which the island phases of the hardness adjuster (B) are dispersed in the sea phase of the styrene resin (A); and each of the island phases of the hardness adjuster (B)

includes the sea phase (white part) of the polypropylene (b1) and the island phases (black part) of the propylene based elastomer (b2) is confirmed to be present, symbol o is given when the presence of the three-phase structure is confirmed, and symbol x is given when the presence is not confirmed. In the case where the three-phase structure is confirmed to be present, regarding whether or not the area ratio (%) of the island phases of the polypropylene (b1) and the propylene based elastomer (b2) is in the range of 10 to 40%, symbol o is given when the area ratio is in that range, and symbol x is given when the area ratio is not in that range.

2. Dynamic Viscoelasticity Measurement

A film-shape sample section (width 5 mm×thickness 1 mm) of the mask adhesive is prepared. The maximum value of tan δ and storage elastic modulus at 25° C. of the sample section of the mask adhesive is measured using the dynamic viscoelastmeter RSA-II (TA Instruments). Measurement is performed in a nitrogen atmosphere, with the tension mode, 1 Hz, at the measurement temperature of −80 to 120° C., at a heating rate of 3° C./min, and with the initial gap being set to 20 mm. In Table 1, symbol o is given when the maximum value of tan δ is 1.5 to 5, and symbol x is given when the maximum value of tan δ is not in that range. Further, symbol o is given when the storage elastic modulus at 25° C. is $4.1 \times 10^5$ Pa·s to $1.0 \times 10^9$ Pa·s, and symbol x is given when the storage elastic modulus at 25° C. is not in that range.

3. Infrared Absorption Spectrum

The mask adhesive is laminated between TEFLON (registered trademark) sheets (Toray Industries, Inc.) and is heat pressed using a pressing machine of 200° C., to prepare a thin film-shape mask adhesive. A film of the mask adhesive is peeled off from the TEFLON (registered trademark) sheet (Toray Industries, Inc.), and the infrared absorption spectrum in the range of 400 $cm^{-1}$ to 4,000 $cm^{-1}$ is measured using FT-IR FTS-3100 (Varian). In Table 1, regarding whether or not to confirm the absorption peak derived from 1-butene in the region of 761 $cm^{-1}$ to 767 $cm^{-1}$, symbol o is given when the absorption peak is confirmed, and symbol x is given when not confirmed.

4. Distortion Amount of Mask

At normal temperature, the pellicle and the mask are loaded on the pellicle mounter (Matsushita Seiki Co., Ltd.), and the pellicle is pressed against the mask. The pellicle is pressed under room temperature, at a pressure of 20 kgf/$cm^2$, for three minutes. The distortion amount at this time of the mask having the pellicle mounted is measured by the flatness measurement analyzer, UltraFlat200 Mask (Corning Tropel). The measurement area is 146 $mm^2$. The mask is made of quartz glass and has a thickness of 6.35 mm.

A mask having a pellicle mounted is generally distorted in an arched way in line with distortion of the aluminum frame of the pellicle. Measurement of the whole mask by the flatness measurement analyzer, UltraFlat200 Mask (Corning Tropel Co.), shows how the mask is distorted by a contour line graph, and displays the difference of the distortion amount between the maximum value and the minimum value as a distortion value of the mask. Thus obtained difference between distortion value (1) of the whole mask before mounting the pellicle and distortion value (2) of the whole mask after mounting the pellicle is defined as the distortion amount of the mask induced by distortion of the pellicle. A smaller distortion amount of a mask is preferable, and 0 (no distortion) is most preferable.

5. Position Deviation Amount of Patterns

A wafer is exposed twice via the mask having a pellicle mounted, using semiconductor exposure equipment, ArF immersion scanner NSR-S610C (Nikon Corporation), to print patterns on the wafer. As a wafer, a 6025 substrate having a thickness of 6.35 mm and a length of 151.95 mm is used. Specifically, the second exposure is performed after displacing the mask from the position at which the first exposure is performed. Observation is made by SEM on whether or not the pattern formed by the second exposure is formed at the position corresponding to the position at which the mask has been displaced. A distance between the pattern formed by the first exposure and the pattern formed by the second exposure is obtained by observation by SEM; and then the difference between the obtained distance and the displacing distance of the mask based on the designed value is defined as the position deviation amount of patterns. The position deviation amount of patterns is preferably as small as possible.

6. Adhesive Residue and Handling Characteristics

Visual observation is made on whether or not a mask adhesive remains on a mask after a pellicle is peeled off from the mask, by irradiating the mask using the lighting equipment (Sena and Vans Co., Ltd.) (illuminance: 300,000 lux) to reflect light on the mask surface. Further, as for the handling characteristics, visual observation is made on whether or not the mask adhesive is easily detached from a hand when touched by the hand.

With the mask adhesive of Examples 1 to 6, as shown in Table 1, a three-phase sea-island structure of the styrene resin (A), the polypropylene (b1), and the propylene based elastomer (b2) is observed. Further, the maximum values of tan δ of the mask adhesives of Examples 1 to 6 range from 1.7 to 2.0, and the storage elastic modulus ranges from $4.4 \times 10^5$ to $28 \times 10^5$ Pa·s, showing that each of the values is high.

Figure 3:
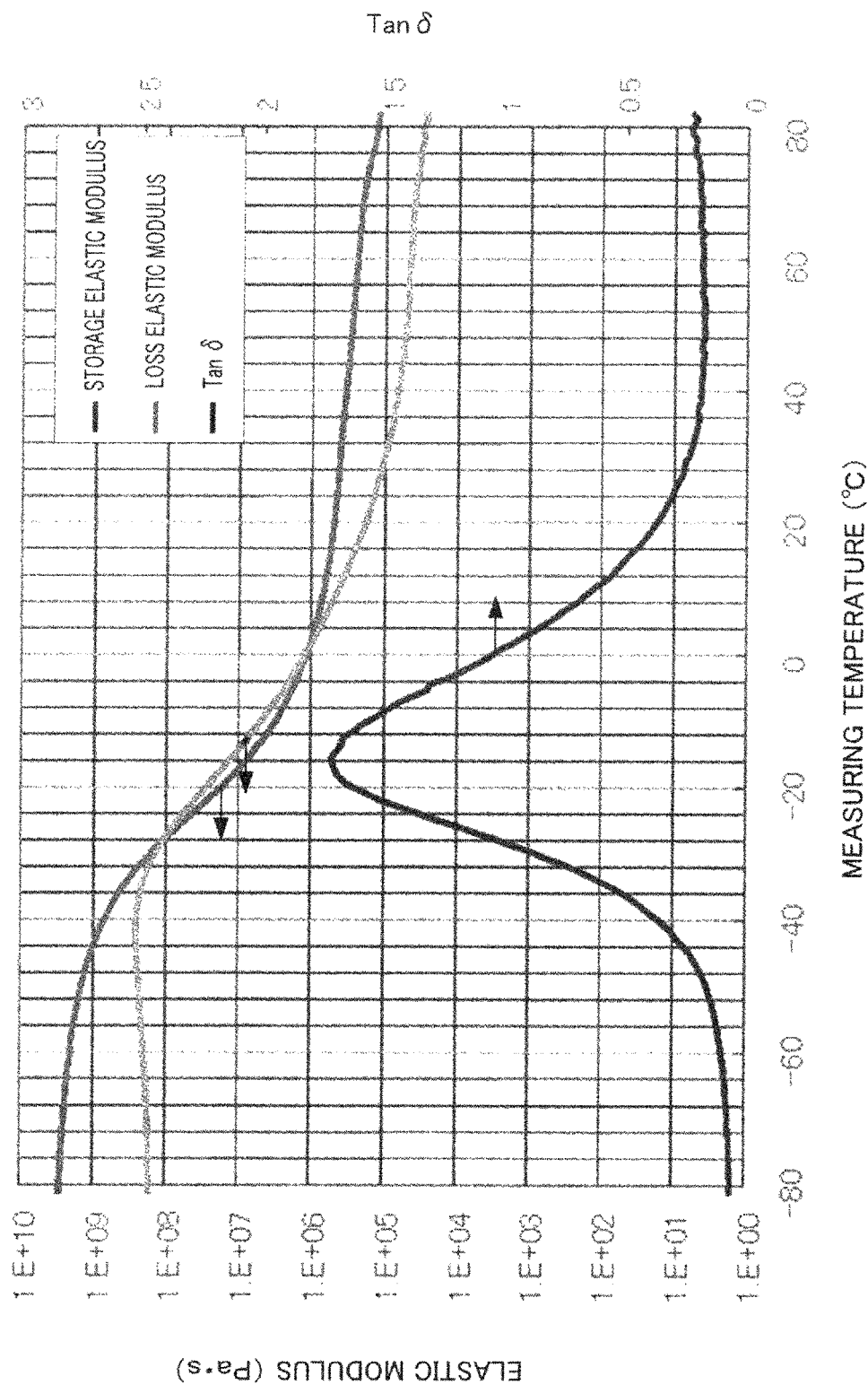
FIG. 3 is a graph showing the measurement result of the viscoelasticity of a mask adhesive layer according to Examples.

Among those, the transmission electron microscope photograph of the mask adhesive of Example 1 is shown in above-described FIG. 1. As shown in FIG. 1, the three-phase structure is confirmed in which a sea phase of the styrene resin (A) and island phases of the hardness adjuster (B) are observed; and the island phase of the hardness adjuster (B) includes two color regions: the stained region and the non-stained region. The measurement result of the dynamic viscoelasticity of the mask adhesive of Example 1 is shown in FIG. 3. Tan δ of the mask adhesive of Example 1 becomes the maximum at around −16° C.

When the pellicles using the mask adhesives of Examples 1 to 6 are used, distortion amount of the masks is 105 nm or less. Position deviation amount of patterns is 2.0 nm or less, which is sufficient for double patterning. Even after the pellicle is peeled off from the mask, a mask adhesive does not remain on the mask and therefore an adhesive residue does not occur. Further, when the mask adhesive is touched by a hand, the mask adhesive does not stretch but is detached immediately from the hand, and thus the handling is good.

In contrast, a sea-island structure cannot be observed in either of the mask adhesives of Comparative Examples 1 to 7. Further, when any of the mask adhesives of Comparative Examples 1 to 7 is used, the large maximum value of tan δ and the high storage elastic modulus are not achieved at the same time.

A sea-island structure is not observed and the maximum value of tan δ is low with each of the mask adhesives of Comparative Examples 1 to 3 and 5, showing that the position deviation amount of patterns is large, being about 7 to 10 nm. On the other hand, the storage elastic modulus is appropriately high for Comparative Examples 1 to 3, and therefore the amount of the adhesive residue is small and the handling characteristics is good.

The mask adhesive of Comparative Example 4 does not contain the hardness adjuster (B), and therefore a sea-island structure is not observed. The maximum value of tan δ of the mask adhesive is relatively high, being 2, showing that the mask adhesive is appropriately soft and the distortion amount and position deviation of patterns of the mask can be reduced. However, because the storage elastic modulus is low, an adhesive residue remains on the mask and the handling characteristics of the mask adhesive is poor.

The mask adhesive of Comparative Example 6 containing a large content of the hardness adjuster (B) shows the continuous phase of the hardness adjuster (B), and the mask adhesive of Comparative Example 7 containing a smaller content of the hardness adjuster (B) shows substantially a single phase of the styrene resin (A), and therefore a sea-island structure is not observed in the both Comparative Examples. The mask adhesive of Comparative Example 6 has a relatively high storage elastic modulus and therefore an adhesive residue and the like does not remain on the mask. However, the maximum value of tan δ is low and therefore the position deviation amount of patterns is large, being 6 nm. On the other hand, the mask adhesive of Comparative Example 7 has the large maximum value of tan δ and therefore the position deviation amount of patterns is small. However, the storage elastic modulus is relatively high and therefore the adhesive residue remains on the mask.

The disclosure of Japanese Patent Application No. 2009-233576, filed on Oct. 7, 2009, including the specification, drawings and abstract, is incorporated herein by reference in its entirety.

INDUSTRIAL APPLICABILITY

The pellicle according to the present invention includes a mask adhesive layer having appropriate softness and producing less adhesive residue after being peeled off from a mask, and thus having good handling characteristics. For this reason, the pellicle according to the present invention is suitable for patterning which requires high patterning accuracy, such as double patterning.

REFERENCE SIGNS LIST 10 pellicle
12 pellicle membrane
13 membrane adhesive layer
14 pellicle frame
15 mask adhesive layer

The invention claimed is:

1. A pellicle comprising:
 a pellicle frame;
 a pellicle membrane disposed on one end surface of the pellicle frame; and
 an adhesive layer disposed on the other end surface of the pellicle frame,
 wherein the adhesive layer consists of a mask adhesive which contains 100 weight parts of a styrene resin (A) and 35 to 170 weight parts of a hardness adjuster (B) containing a homopolypropylene or random polypropylene containing 5 mol % or less of a comonomer component (b1) and a propylene based elastomer (b2); and
 in an electron microscopic photograph of the mask adhesive, a phase-separated structure of a continuous phase of the styrene resin (A) and a discontinuous phase of the hardness adjuster (B) is observed.

2. The pellicle according to claim 1, wherein the discontinuous phase of the hardness adjuster (B) includes a continuous phase of the polypropylene (b1) and a discontinuous phase of the propylene based elastomer (b2).

3. The pellicle according to claim 1, wherein a maximum value of tan δ in dynamic viscoelasticity of the mask adhesive layer is 1.5 to 5, and storage elastic modulus of the mask adhesive at 25° C. is $4.1 \times 10^5$ Pa·s to $1 \times 10^9$ Pa·s.

4. The pellicle according to claim 1, wherein a mass ratio of the polypropylene (b1) to the propylene based elastomer (b2) is 10:90 to 30:70.

5. The pellicle according to claim 1, wherein the mask adhesive has an absorption peak in a region of 761 $cm^{-1}$ to 767 $cm^{-1}$ in an infrared absorption spectrum.

6. The pellicle according to claim 1, wherein
 the styrene resin (A) is a styrene-ethylene-butylene-styrene copolymer; and
 the propylene based elastomer (b2) is a propylene-butene-ethylene copolymer.

7. A mask adhesive for securing a pellicle on a mask, the mask adhesive comprising:
 100 weight parts of a styrene resin (A) and 35 to 170 weight parts of a hardness adjuster (B) containing a homopolypropylene or random polypropylene containing 5 mol % or less of a comonomer component (b1) and a propylene based elastomer (b2);
 wherein, in an electron microscopic photograph, a phase-separated structure containing a continuous phase of the styrene resin (A) and a discontinuous phase of the hardness adjuster (B) is observed.

8. The mask adhesive according to claim 7, wherein the discontinuous phase of the hardness adjuster (B) contains a continuous phase of the polypropylene (b1) and a discontinuous phase of the propylene based elastomer (b2).

9. The mask adhesive according to claim 7, wherein a maximum value of tan δ in dynamic viscoelasticity is 1.5 to 5, and a storage elastic modulus at 25° C. is $4.1 \times 10^5$ Pa·s to $1 \times 10^9$ Pa·s.

10. The mask adhesive according to claim 7, wherein a mass ratio of the polypropylene (b1) to the propylene based elastomer (b2) is 10:90 to 30:70.

11. The mask adhesive according to claim 7, wherein the mask adhesive has an absorption peak in a region of 761 $cm^{-1}$ to 767 $cm^{-1}$ in an infrared absorption spectrum.

12. The mask adhesive according to claim 7, wherein:
 the styrene resin (A) is a styrene-ethylene-butylene-styrene copolymer; and
 the propylene based elastomer (b2) is a propylene-butane-ethylene copolymer.

* * * * *